United States Patent
Eguchi et al.

(10) Patent No.: US 9,224,478 B2
(45) Date of Patent: Dec. 29, 2015

(54) TEMPERATURE-BASED ADAPTIVE ERASE OR PROGRAM PARALLELISM

(71) Applicants: Richard K. Eguchi, Austin, TX (US); Jon S. Choy, Austin, TX (US); Chen He, Austin, TX (US); Kelly K. Taylor, Austin, TX (US)

(72) Inventors: Richard K. Eguchi, Austin, TX (US); Jon S. Choy, Austin, TX (US); Chen He, Austin, TX (US); Kelly K. Taylor, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 121 days.

(21) Appl. No.: 13/787,799

(22) Filed: Mar. 6, 2013

(65) Prior Publication Data

US 2014/0254285 A1   Sep. 11, 2014

(51) Int. Cl.
| | |
|---|---|
| *G11C 16/04* | (2006.01) |
| *G11C 16/10* | (2006.01) |
| *G11C 7/04* | (2006.01) |
| *G11C 16/14* | (2006.01) |
| *G11C 16/30* | (2006.01) |
| *G11C 16/34* | (2006.01) |

(52) U.S. Cl.
CPC ...... *G11C 16/10* (2013.01); *G11C 7/04* (2013.01); *G11C 16/14* (2013.01); *G11C 16/30* (2013.01); *G11C 16/349* (2013.01)

(58) Field of Classification Search
CPC ......... G11C 16/16; G11C 16/14; G11C 16/10
USPC .................................. 365/185.29, 185.18
See application file for complete search history.

(56) References Cited

U.S. PATENT DOCUMENTS

| | | | |
|---|---|---|---|
| 5,991,201 A | 11/1999 | Kuo et al. | |
| 7,079,424 B1 | 7/2006 | Lee et al. | |
| 7,173,859 B2 | 2/2007 | Hemink | |
| 7,177,199 B2 | 2/2007 | Chen et al. | |
| 2006/0280012 A1* | 12/2006 | Perner | 365/212 |
| 2010/0322005 A1* | 12/2010 | Dong et al. | 365/185.17 |
| 2011/0299335 A1* | 12/2011 | Lee et al. | 365/185.03 |
| 2012/0201082 A1 | 8/2012 | Choy et al. | |
| 2012/0327710 A1 | 12/2012 | He et al. | |
| 2012/0327720 A1 | 12/2012 | Eguchi et al. | |

OTHER PUBLICATIONS

"Flash memory," *Wikipedia*, retrieved from http://en.wikipedia.org/w/index.php?title=Flash_memory&oldid=528921322 , Dec. 20, 2012.
"EEPROM," *Wikipedia*, retrieved from http://en.wikipedia.org/w/index.php?title=EEPROM&oldid=526650650 , Dec. 6, 2012.

* cited by examiner

*Primary Examiner* — Huan Hoang

(57) ABSTRACT

A method includes, in one implementation, performing a memory operation to place memory cells of a memory array to a first logic state using a voltage of a charge pump. A portion of the operation is performed on the memory cells using the voltage of the charge pump. A temperature of the memory array is compared to a threshold. If the temperature is above a reference level, a load on the charge pump is reduced by providing the voltage to only a reduced number of memory cells.

18 Claims, 8 Drawing Sheets

TEMPERATURE-BASED ADAPTIVE ERASE OR PROGRAM PARALLELISM

This application is related to U.S. patent application Ser. No. 13/170,009, filed on Jun. 27, 2011, titled "Adaptive Write Procedures for Non-Volatile Memory," and naming Chen He and Richard Eguchi as inventors. The above-noted application is hereby incorporated by reference herein.

FIELD OF THE INVENTION

The present disclosure relates in general to non-volatile memories, and more specifically to a system and method for adaptively programming and erasing non-volatile memory in view of temperature conditions.

BACKGROUND

Device leakage is a challenge for the design and operation of non-volatile memories such as erasable programmable read only memories (EPROMs), electrically erasable programmable read only memories (EEPROMs), and block-erasable EEPROMs (e.g., "flash" memories), etc. Device leakage increases the loads on the supply components, such as charge pumps, within a non-volatile memory (NVM) module and can lead to degraded performance. Another problem is reduced signal-to-noise immunity at low voltage due to low-voltage drive-strength roll off. Moreover, the transconductance degradation of memory cells with cycling can be significant, especially with smaller cell sizes.

For erase procedures, increased device leakage may cause significant loading on charge pumps that are used to supply erase biases. As a result, memory cells may receive inefficient erase pulse bias levels, and may fail to erase. For program procedures, increased column leakage may cause significant loading on drain charge pumps. As a result, memory cells may receive very inefficient program pulse bias levels, and may fail to be properly programmed.

BRIEF DESCRIPTION OF THE DRAWINGS

A skilled practitioner will appreciate the benefits, features, and advantages of the present disclosure with reference to the following description and accompanying drawings. The figures are not necessarily drawn to scale.

DETAILED DESCRIPTION

Figure 1:
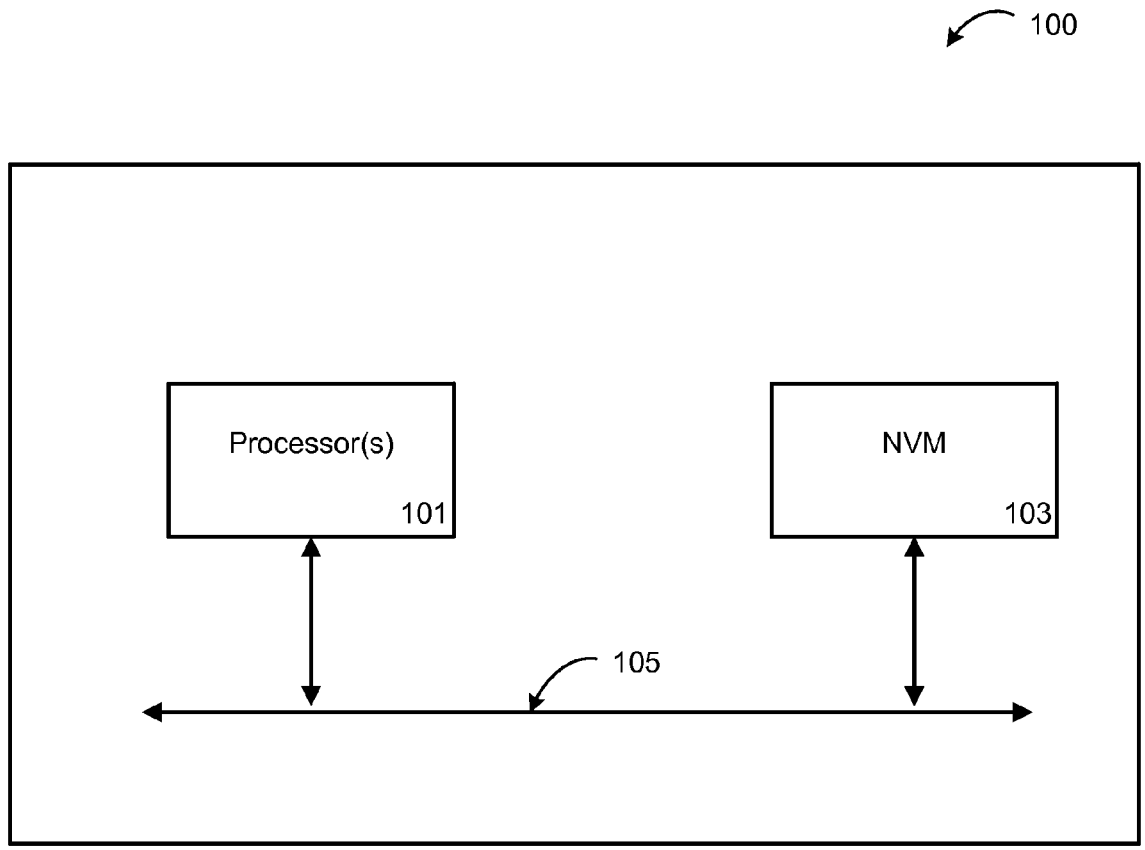
FIG. 1 is a block diagram showing an example of an integrated circuit including a non-volatile memory (NVM) according to one embodiment of the present invention.

The following description is presented to enable one of ordinary skill in the art to make and use the technology of the present disclosure as provided within the context of particular applications and their requirements. Various modifications to the disclosed embodiments will be apparent to one skilled in the art, and the general principles described herein may be applied to other embodiments. Therefore, this disclosure is not intended to be limited to the particular embodiments shown and described herein, but is to be accorded the widest scope consistent with the principles and novel features herein disclosed.

Systems and methods are disclosed that selectively reduce device loading during the operation of a non-volatile memory (NVM) module. The reduced loading can be based, among other factors, on real-time operating conditions of the NVM module. In one example, the loading can be reduced in response to a determination that charge pumps, or other voltage supplies or current supplies in the NVM module, may be unable to supply the required voltages for higher loads. Increased loading can occur, for example, due to various forms of device leakage in the NVM module. One factor that can contribute to increased device leakage is an increased temperature of the NVM module.

In general, device leakage increases with increased temperature. In many situations, device leakage has an exponential dependence on temperature. Various factors can elevate the operating temperature of an NVM module. For example, the NVM module may be deployed in an environment that is expected to reach high temperatures, such as within or near the engine compartment of an automobile or other vehicle. High temperatures may also arise due to the failure of cooling equipment, or due to high processing demands placed on the NVM.

One approach to determining when an NVM module should operate with reduced erase loading and/or reduced program loading is to monitor an operating temperature of the NVM module. At higher temperatures, the NVM module may be expected to suffer degrading effects, such as increased device leakage. By reducing the load on the charge pumps at higher temperatures, the NVM can avoid situations in which the charge pumps are unable to meet the demands of the load. This reduction may also be helpful to avoid degradation, and to extend the lifetime of the NVM module. Alternatively, or in addition, the load on the charge pumps can be based on a determination that the supply components are at least partially overloaded (e.g., charge pumps are unable to supply the requisite voltage for higher loads).

For example, an NVM module may be configured to reduce the number of bits that are programmed or erased in parallel during high-temperature write operations or other memory operations conducted during conditions of elevated temperature. Such a subset-programming operation, or subset-erasing operation, decreases the current required during the operation, and can help avoid a situation of pulled-down supply voltage that may otherwise result from increased device leakage at high temperatures.

One example of subset erase is to split an NVM array in half, and erase one half at a time. If the subset erase is configured statically—for all erase operations—the NVM module will incur a performance penalty even when the subset program/erase is not needed (e.g., at low temperatures or in parts without much device leakage due to better manufacturing process). Therefore, a subset-program and/or subset-erase option can be adaptively enabled when needed to maximize part performance and reliability. The NVM module can be configured, for example, so that the subset program and erase are performed only when the NVM module is operating at higher temperatures and/or when increased leakage is detected. A threshold temperature for enabling subset-program and/or subset-erase options can be set as a fixed value, such as 75° C. or 150° C. Multiple threshold temperatures may be used for enabling various degrees of parallelism. The threshold temperature(s) may be programmable or adaptable, based on part wearing over the lifetime of the NVM module, or a poor leakage performance characteristic measured in an individual NVM module after manufacture, or other factors, or combinations thereof.

FIG. 1 is a block diagram showing an example of an integrated circuit (IC) 100 including a non-volatile memory (NVM) 103. In the illustrated example, the integrated circuit 100 may be implemented as a system on a chip (SOC) or the like with at least one processor 101 coupled to NVM 103 through an appropriate interface 105, such as a bus or the like with multiple signals or bits. IC 100 can include other circuits, modules or devices, such as other memory devices (not shown), other functionality modules (not shown), and interfaces, such as input, output, or input/output (I/O) ports or pins or the like (not shown). In one alternative implementation, NVM 103 is integrated by itself on the IC 100, without any other circuit modules. In another implementation, processor 101, NVM 103, and interface 105 are part of a larger system on IC 100.

Figure 2:
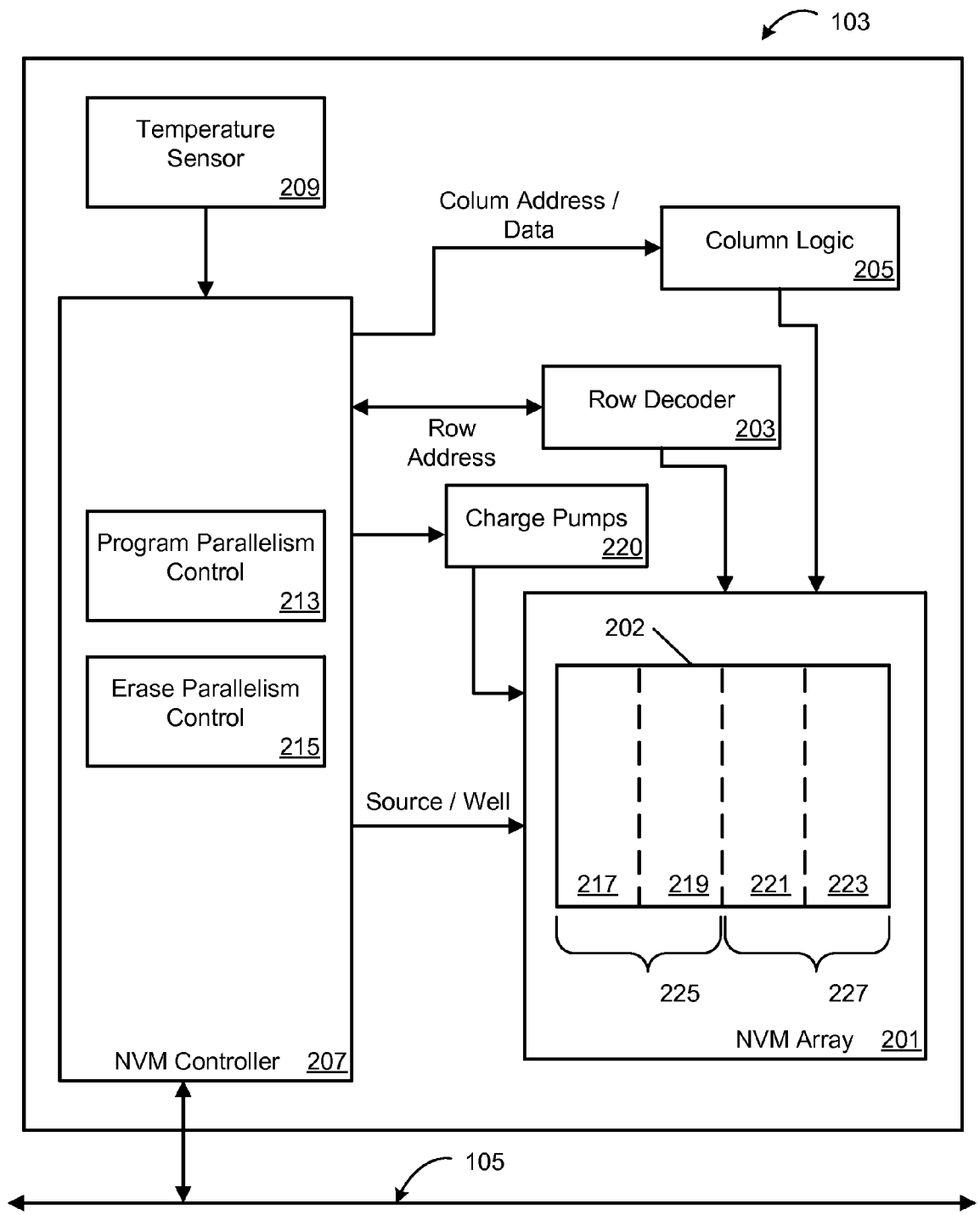
FIG. 2 is a block diagram showing an example of an NVM according to one embodiment of the present invention.

FIG. 2 is a block diagram showing an example of NVM 103. NVM 103 includes an NVM array 201, a temperature sensor 209, a row decoder 203, a column logic 205, charge pumps 220, and an NVM controller 207. Row decoder 203 is coupled to NVM array 201. Column logic 205 is coupled to NVM array 201. NVM controller 207 is coupled to interface 105, temperature sensor 209, NVM array 201, column logic 205, and row decoder 203. Charge pumps 220 are coupled to NVM array 201 and NVM controller 207. Column logic 205 incorporates a column decoder and sense amplifiers (not shown) and each interface can be configured to carry multiple signals such as multiple bits in parallel (e.g., multiple bits communicated simultaneously). NVM controller 207 controls operation of NVM array 201 through row decoder 203 and column logic 205, such as in response to instructions communicated from processor(s) 101 through interface 105 or other interfaces. NVM controller 207 accesses memory cells within NVM array 201 by providing a row address to row decoder 203 and a column address to column logic 205. Data is written into or read from NVM array 201 via the column logic 205. NVM controller 207 also drives source and well voltages (via corresponding switches and controllers, not shown) to NVM array 201 via charge pumps 220. Charge pumps 220 can include a negative charge pump that provides erase gate voltage, a positive charge pump that provides program gate voltage and erase positive well (pwell) voltage, and a drain pump that provides program drain voltage.

Shown within NVM controller 207 is a program parallelism control 213, and an erase parallelism control 215. NVM controller 207 receives a temperature measurement signal from temperature sensor 209. NVM controller 207 determines whether a measured temperature is sufficiently high that NVM array 201 should operate using some reduced degree of parallelism. For example, NVM controller 207 can be configured to provide indicators of whether the temperature measured by temperature sensor 209 is less than a threshold level to program parallelism control 213 and erase parallelism control 215.

Program parallelism control 213 and erase parallelism control 215 determine the number of bits in the memory array 201 to be programmed and erased in parallel. This determination can be based on input from NVM controller 207, such as the measured temperature from sensor 209.

NVM array 201 incorporates one or more blocks of memory cells in which each memory block has a selected block size, such as, for example, 16 kilobytes (kB), 32 kB, 64 kB, 128 kB, 256 kB, etc. In some embodiments, memory cells in NVM array 201 typically have a gate (G) terminal, a drain (D) terminal and a source (S) terminal along with isolated wells including a pwell (PW) and an nwell (NW). In one implementation, each memory block is organized into rows and columns of the memory cells. The gate terminal of each row of memory cells is coupled to a corresponding one of multiple wordlines coupled to the row decoder 203. The drain terminal of each column of memory cells is coupled to a corresponding one of multiple bit lines coupled to the column logic 205. The source terminal and wells (PW and NW) of each memory cell are driven or controlled by NVM controller 207.

As shown, NVM array 201 includes at least one memory block 202 that is configured to allow program and erase operations to be performed with configurable parallelism. For instance, for erase operations, memory block 202 is configured to allow an erase operation to be performed on the entire block or just a subset of memory block 202. Memory block 202 is shown with dashed lines for subsets 225, 227 each including half of the memory cells in memory block 202, and subsets 217, 219, 221, 223 each including one-fourth of the memory cells in memory block 202. In various implementations, other subsets containing other numbers of the memory cells are used.

As an example, an NVM module can be configured to initiate an erase operation as an in-bulk routine on all memory cells in a selected memory block (e.g., memory block 202 from FIG. 2). If a temperature measured by temperature sensor 209 is greater than a predetermined acceptable value at a selected point of the erase operation, a first subset of the memory cells can be selected for further erasing (e.g., subset 225 or subset 221 from FIG. 2). In various situations, this subdividing of the erase operation will reduce the load on the charge pumps and enable the charge pumps to output the intended pwell voltage. After an erase procedure is complete for the first subset, the erase procedure may be performed on a second subset of the memory cells (e.g., subset 227 or subset 223 from FIG. 2).

In another example, program procedures are performed on groups of memory cells in a selected memory block, such as groups of 18 memory cells at a time. If a temperature measured by temperature sensor 209 is not below a predetermined value at a selected point of the program operation, a subgroup of the memory cells (e.g., 9, 6, or 3 memory cells) can be selected for further programming. This will reduce the load on the charge pumps and enable the charge pumps to output the intended drain voltage. After the program operation is complete for the first subgroup, the program operation may be performed on other subgroups.

The memory cells in memory array 201 can be implemented according to any one of several configurations, such as semiconductor configurations, layered silicon-metal nano crystals, etc. In one implementation, each memory cell is implemented on a silicon substrate or the like. In another implementation, the pwell of each memory cell is isolated from a P substrate with the nwell. In various embodiments, a pair of n+ type doped regions (not shown) is formed in the pwell forming the drain and source terminals of each memory cell. Each memory cell can further include a stacked gate structure or the like, including an oxide layer (not shown) formed on the pwell, a floating gate (not shown) provided on the oxide layer, a dielectric layer (not shown) provided on the floating gate, and a control gate (not shown) provided on the dielectric layer forming a gate terminal. In some embodiments, the pwell is generally coupled to a ground voltage Vss and the nwell is generally coupled to a source voltage Vdd except during Fowler-Nordheim (FN) erase pulses as described herein. The voltage level of Vdd depends upon the particular implementation. In one embodiment, Vdd is approximately 3.3 Volts (V).

In various implementations, when a voltage pulse is applied to a memory cell (e.g., cells of memory block 202) during erase and program operations as further described herein, the pwell and nwell of the memory cell are coupled or otherwise driven together to collectively receive a ramp pulse voltage.

In various implementations, an "erase pulse" is applied to a memory cell by driving the gate terminal of the memory cell to a selected erase pulse voltage, and by applying a series of erase ramp pulses to the pwell and nwell of the memory cell. The magnitude of the erase ramp pulse voltage applied to pwell and nwell is incrementally increased or otherwise ramped higher with each application of an erase pulse to the memory cells until each cell has been erased. Thus, each erase pulse applied to the memory cells includes an erase pulse voltage applied to the gate terminal and an erase ramp pulse voltage applied to at least one well connection of the memory cells.

In various implementations, a "program pulse" is applied to a group of memory cells by driving the gate terminal of the memory cells to a selected program gate voltage, and by driving the drain terminal of the memory cells to a selected program drain voltage. Program pulses are applied to the group of memory cells until the each memory cell in the group is programmed. This procedure can be repeated for other memory cells in the memory block until the entire memory block is programmed.

In various examples of NVM technology described herein, an erase ramp pulse voltage is applied to the pwells and nwells of the memory cells while the gate terminals receive an erase pulse voltage having a relatively fixed magnitude. In alternative implementations, such as those using other NVM technologies and the like, the erase ramp pulse voltage is instead applied to a different connection or terminal of the memory cells being erased, such as the gate terminal or the like.

Similarly, in various examples of NVM technology described herein, a program pulse voltage is applied to the gate of the memory cells while the drain terminals receive a different program pulse voltage having a relatively fixed magnitude. In other examples, such as those using other NVM technologies and the like, the program voltages are instead applied to a different connection or terminal of the memory cell being programmed.

Figure 3:
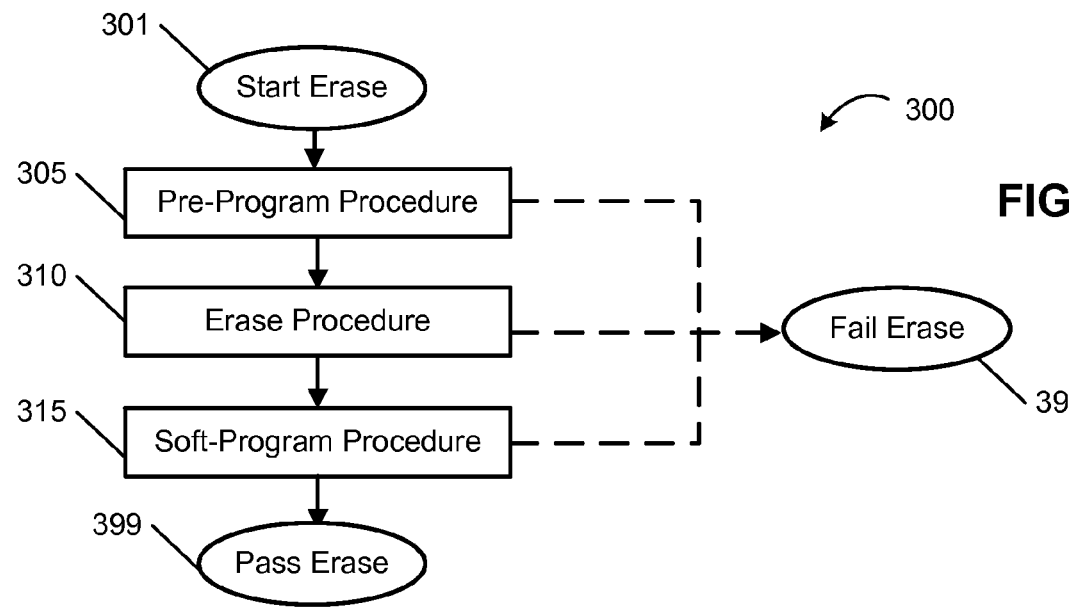
FIG. 3 is a flow diagram showing an example of an erase operation according to one embodiment of the present invention.

FIG. 3 is a flow diagram showing an example of an erase operation 300. Erase operation 300 may be used, for example, to erase data in a set of NVM bits such as memory block 202 within NVM array 201 of FIG. 2. This example of an erase operation includes three procedures. The erase operation proceeds from a start 301 to a pre-program procedure 305, an erase procedure 310, and a soft-program procedure 315. If all three procedures 305, 310, 315 are successfully completed, the erase operation is passed 399. If any of the three procedures 305, 310, 315 is unsuccessful, the erase operation is deemed to have failed 395.

During an erase operation of an NVM, a pre-program procedure may be performed to raise the threshold voltages of the memory cells of the memory block to a level at or above a program verify voltage. The pre-program procedure may be followed by a Fowler-Nordheim (FN) erase procedure to lower the threshold voltages of the memory cells of the memory block to a level at or below an erase-verify voltage. The resulting distribution may, however, include memory cells which have been over-erased, which may increase column leakage. The problem of column leakage increases as the memory cells are further scaled, causing, for example, a subsequent program operation to fail due to lowered drain bias, or a read procedure to fail since the over-erased memory cells may prevent sense amplifiers from distinguishing between an erased cell and a programmed cell. A soft-program procedure may be used after the FN erase procedure to compress the distribution of the erased cells' threshold voltages, so as to reduce the column leakage.

Figure 4:
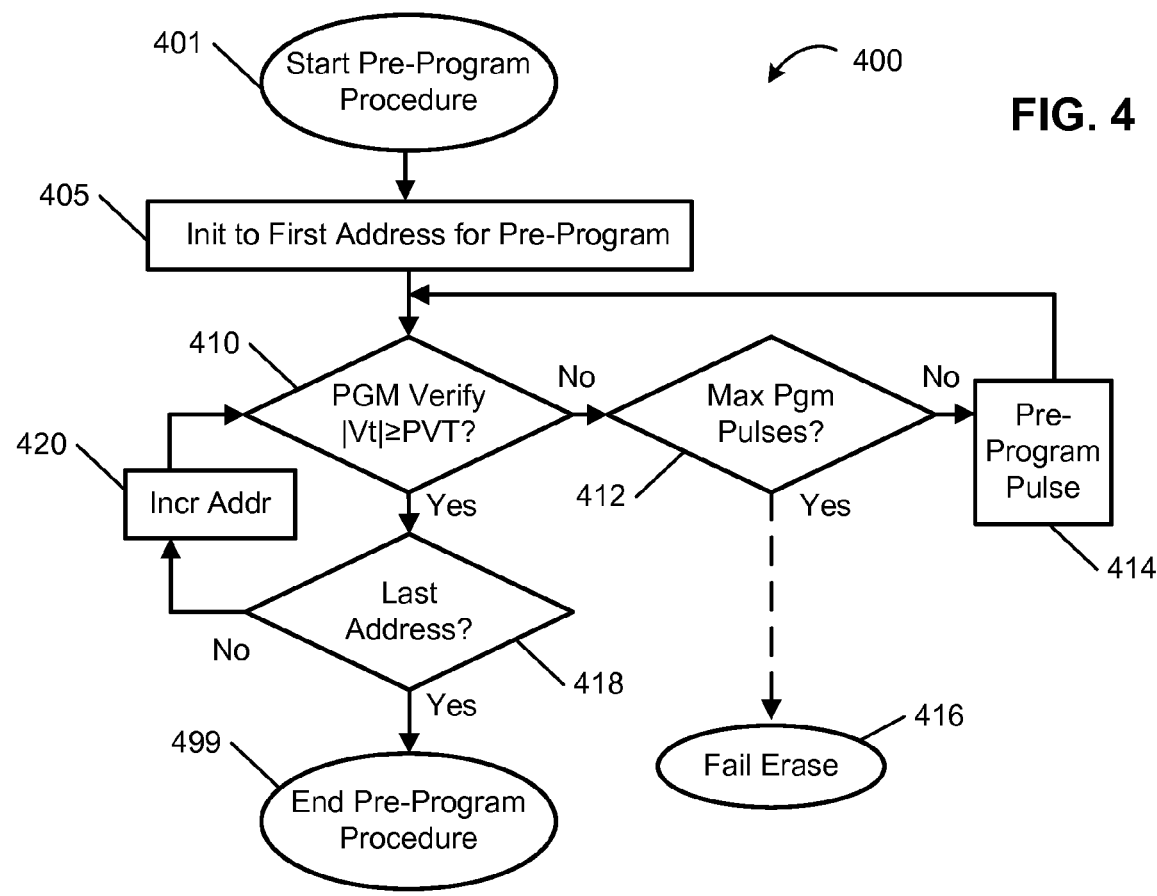
FIG. 4 is a flow diagram showing an example of a pre-program procedure of an erase operation according to one embodiment of the present invention.

FIG. 4 is a flow diagram showing an example of a pre-program procedure 400 of an erase operation. Pre-program procedure 400 can be used as one implementation of pre-program procedure 305 of the erase operation 300 from FIG. 3. Pre-programming is performed on bits in a memory block that were not previously in the program state, so all bits are preconditioned to the same threshold voltage (Vt) state. After starting 401, the pre-programming proceeds in act 405 with initializing a current address, including a current row and column address, to a first address in a memory block (e.g. memory block 202). The current address can be stored using a marker such as a counter, pointer, register, or other indicator.

In act 410, a verification is performed for the current address in the memory block. This verification 410 is a program (PGM) verify test that confirms whether memory cells are programmed and have an appropriate threshold voltage for an NVM PGM state.

Programming and verification may be performed on individual memory cells (bitwise programming, bitwise verification) or on subsets of memory cells. Programming and verification is typically performed on a per-page basis in which each page includes a selected number of memory cells or bits, such as 8, 32, 64, 128, 192, 256, or 512 bits or the like. In various implementations, the cells of a page are logically adjacent (e.g., having a contiguous set of addresses), but may be in non-adjacent geometric locations on a substrate due to physical scrambling. In various implementations, a pre-programming pulse is applied to multiple memory cells or bits at a time, such as a group of up to 18 bits associated with the current address. (In various implementations of a pre-program procedure, the group size can be varied based on a measured temperature.)

In one example of the preprogram verify test, the magnitude of the threshold voltage (Vt) of the memory cells in the current group is compared with a minimum desired program verify threshold (PVT) voltage. If the magnitude of the Vt of any of the memory cells in the current group is below the PVT voltage, for example below 6 V, operation proceeds to act 412. Act 412 determines whether a maximum number of pre-program pulses has been applied to any of the memory cells in the current group. If the maximum number of pre-program pulses has not yet been applied, operation proceeds to act 414 to apply the next program pulse to the memory cells for which Vt is below PVT. Pre-program procedure 400 then returns to act 410. Operation loops among acts 410, 412, and 414 by applying additional pre-program pulses until the magnitude of Vt of each memory cell in the current group is at least PVT. If act 412 determines that the maximum number of pre-program pulses has already been applied to any memory cell in the current group, act 416 indicates that the erase operation (e.g., erase operation 300) has failed.

If the program verify test is passed in act 410 at the current address (e.g., the Vt of each of the memory cells in the current group, as indicated by the current address, is at or above the PVT voltage), then act 418 determines whether the last address in the memory block has been programmed. If the last address has not been programmed, act 420 increments the current address to the next group of memory cells that has not yet undergone the preprogram verify test. Operation then returns to act 410. Operation loops among acts 410, 418, and 420 (and acts 412, 414, as needed) until the Vt of each memory cell of the memory block has undergone program verification 410. Otherwise, if the last address has been verified, pre-program procedure 400 is concluded 499.

Figure 5:
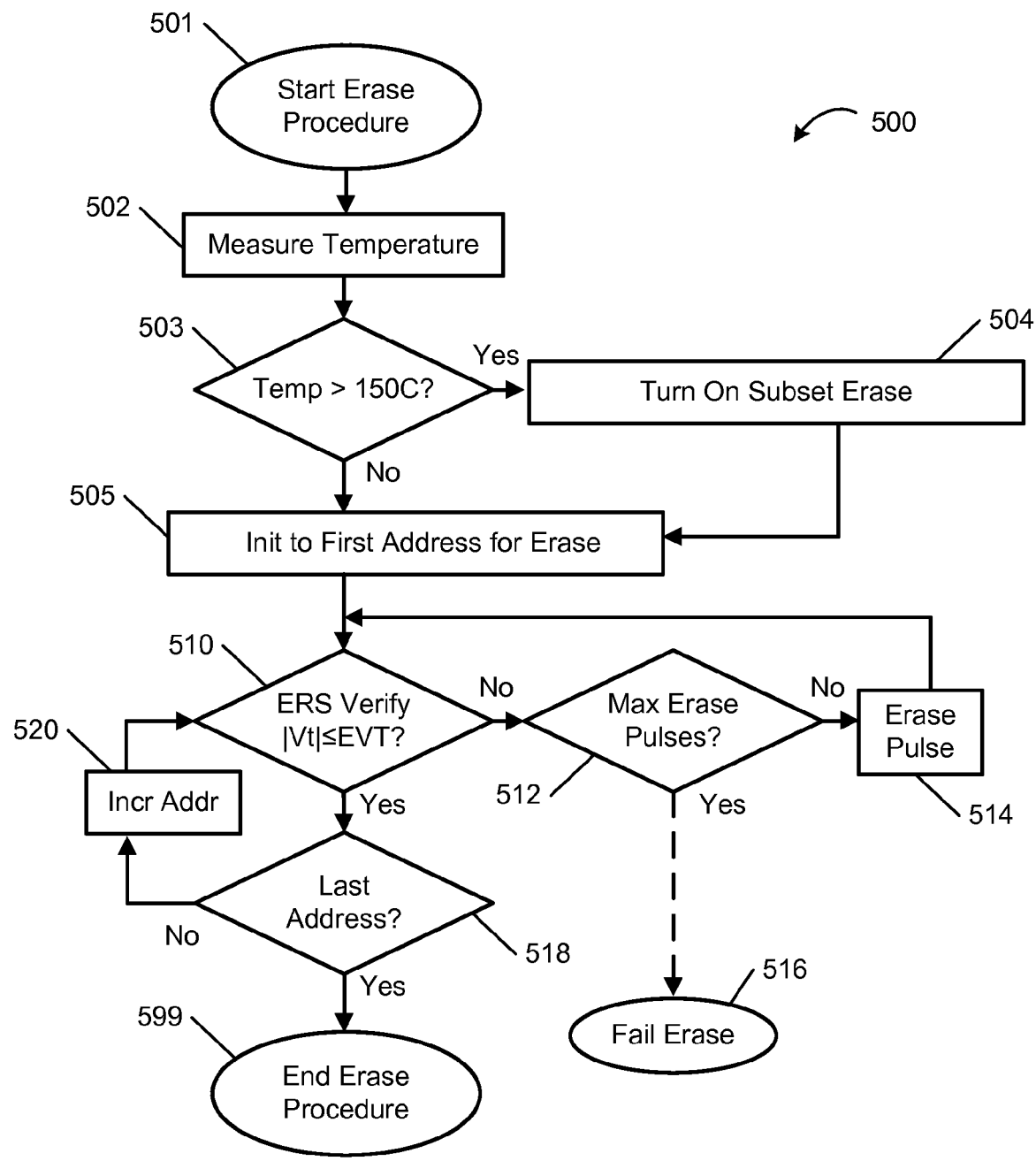
FIG. 5 is a flow diagram showing an example of an erase procedure of an erase operation according to one embodiment of the present invention.

FIG. 5 is a flow diagram showing an example of an erase procedure 500 of an erase operation. Erase procedure 500 can be used as one implementation of erase procedure 310 of the erase operation 300 from FIG. 3, following pre-program procedure 305.

During an initialization act 501, erase procedure 500 is defaulted to be performed on an entire memory block (such as memory block 202), i.e., full erase, as opposed to just a subset of the memory cells in the memory block.

Erase procedure 500 then measures a temperature in act 502. This measurement can be made, for example, by temperature sensor 209 from FIG. 2. In various implementations, the measured temperature is a temperature of a memory block, such as memory block 202, or of a package that houses an NVM module. In other implementations, the measured temperature is a local temperature of a component that is susceptible to leakage, such as charge pumps or storage bits in an NVM module. In other implementations, the temperature measured in act 502 is a temperature measured externally to an NVM module, such as a temperature on or near the surface of a circuit package, a temperature in an engine compartment that houses an NVM module, a temperature of a region that is thermally close to an NVM module, or a temperature that is expected to be at least partly correlated with a temperature of an NVM module.

The measured temperature is then evaluated in act 503. In the illustrated example, a simple test is done with respect to a threshold temperature level, such as 150° C. In act 504, a subset-erase option is activated. As illustrated in FIG. 5, the subset-erase option is activated only if the evaluation from act 503 indicates a hot temperature (e.g., greater than a threshold temperature level). The subset-erase option causes the erase activities to be performed substantially simultaneously on a subset of a memory block (e.g., a half such as subset 225 or 227 or a quarter such as subset 217, 219, 221, or 223) instead of substantially simultaneously on a larger portion of the memory block (e.g., the entire memory block 202). Alternatively, or in addition, other temperature-based and/or non-temperature-based criteria may be used to activate a subset-erase option. Erase procedure 500 continues in act 505 with initializing a current address, including a current row address and a current column address, to a first address in a memory block (e.g. memory block 202).

In act 510, a verification is performed for the current address in the memory block. This verification 510 is an erase (ERS) verify test that confirms whether memory cells in the current group meet an erase metric. If needed, the threshold voltage of one or more memory cells is adjusted, as discussed below.

The application of an erase pulse is typically a bulk operation; an erase pulse can be applied to an entire memory block (if the subset-erase option is not activated) or to a subset of a memory block (if the subset-erase option has been activated). In contrast, the erase verify test is typically performed on a per-page basis in which each page includes a selected number of memory cells or bits, such as 128 bits or the like.

In one example of the erase verify test, the magnitude of the Vt of memory cells on the current read page, as indicated by the current address, is compared with an maximum desired erase verify threshold (EVT) voltage. The EVT voltage represents the erase metric for each of the memory cells. If the magnitude of the Vt of any memory cell in the current read page is above the EVT voltage, for example above 3.5 V, operation proceeds to act 512. Act 512 determines whether a maximum number of erase pulses has been applied to any of the memory cells in the current read page.

If the maximum number of erase pulses has not yet been applied, operation proceeds to act 514 to apply the next incremental erase pulse to the memory cells in the memory block (if the subset-erase option is not activated) or to a subset of a memory block (if the subset-erase option has been activated in act 504) that includes the current read page. Erase procedure 500 then returns to act 510. Operation loops among acts 510, 512, and 514 by applying additional erase pulses until the magnitude of Vt of each memory cell in the current read page is at most EVT. If act 512 determines that the maximum number of erase pulses has already been applied, act 516 indicates that the erase operation (e.g., erase operation 300) has failed.

If the erase verify test is passed in act 510 at the current address (e.g., the Vt of each memory cell of the read page indicated by the current address is not above the EVT voltage), then act 518 determines whether the last address in the memory block has been erase verified. If the last address has not been erase verified, act 520 increments the current address to the next read page that has not yet undergone the erase verify test. Operation then returns to act 510. Operation loops among acts 510, 518, and 520 (and acts 512, 514, as needed) until the Vt of each memory cell of the memory block has undergone erase verification. Otherwise, if the last address has been erase verified, erase procedure 500 is concluded 599.

The example of erase procedure 500 shown in FIG. 5 is set up to handle a block of memory cells that has been divided into two or more subsets, based on a single temperature threshold evaluation (act 503). Other implementations of the erase procedure can be configured to further divide the subsets into sub-subsets. For example, sub-subsets can be enabled if a measured temperature is at or above a second threshold (e.g., 165° C.). Additional thresholds, and additional levels of sub-division, are also contemplated.

As an alternative to, or in addition to, using a temperature threshold (such as act 503), an erase procedure can be configured to enable subset parallelism based on other factors. In various implementations the subset-erase option may be enabled (or switched from larger subsets to smaller subsets) based on a recorded history of the measured temperature. For example, hysteresis can be used as part of the decision logic for subdividing operations on a memory block, or for further subdividing the operations. In various situations, hysteresis can be used to avoid undesired transient toggling in environments that have small temperature fluctuations. For example, the subset-erase option may be enabled only if a threshold temperature (e.g., 150° C.) has been exceeded for more than some time threshold (e.g., 0.25 seconds, 0.5 seconds, 1.0 seconds, 5 seconds, 10 seconds, 30 seconds, two minutes). Such delays can help ensure that the subset-erase option is engaged only in response to a consistently rising temperature.

Similar considerations may be used for returning to whole-block operation in response to a drop in temperature. For example, the subset-erase option may be disabled (or switched from smaller subsets to larger subsets) only if a measured temperature is consistently less than the threshold temperature for more than some time threshold. Alternatively, or in addition, a different, lower, temperature threshold may be used for disabling the subset-erase option in response to a falling temperature. This lower temperature threshold can be set a few degrees, e.g., one, two, five degrees, below the temperature threshold that is used for enabling the subset-erase.

Figure 6:
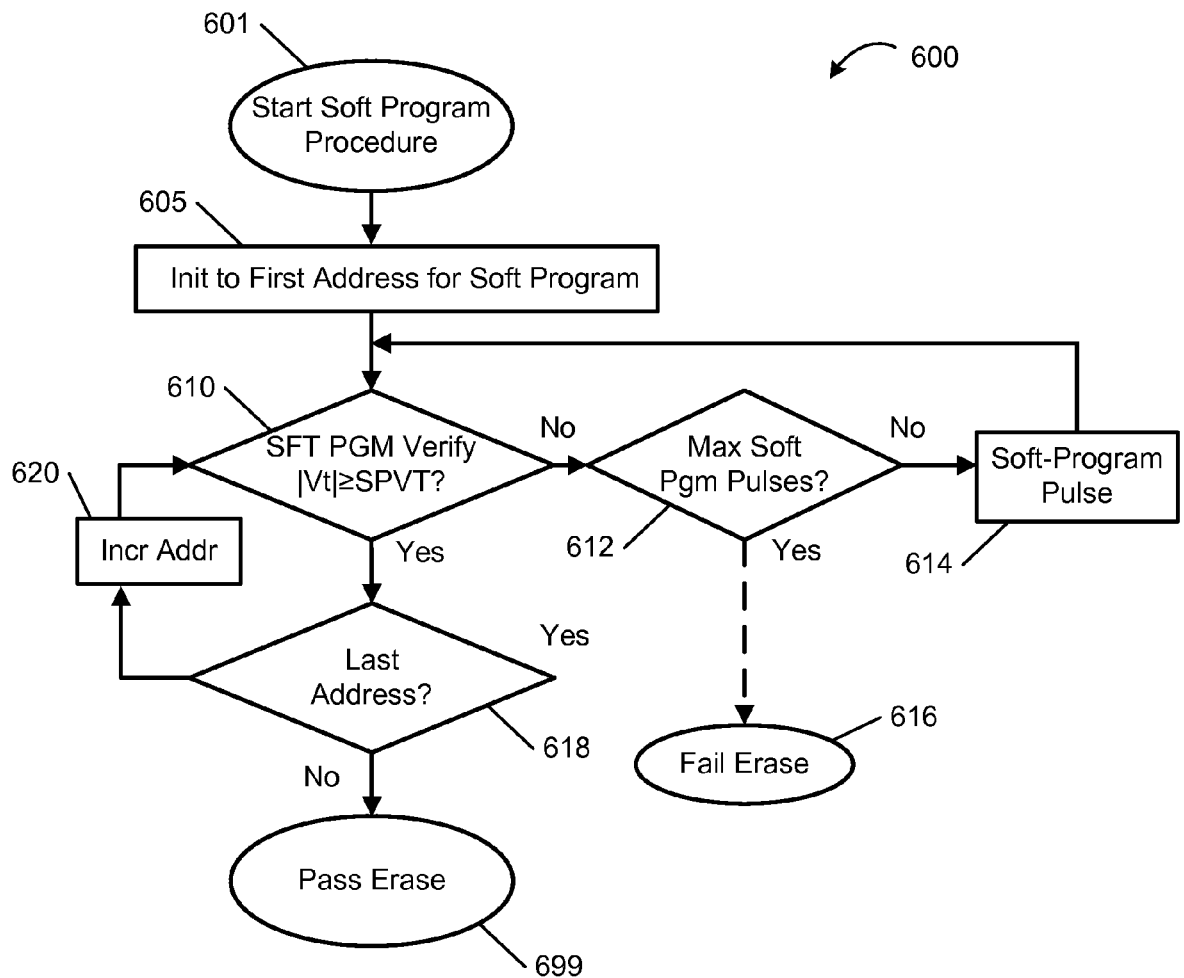
FIG. 6 is a flow diagram showing an example of a soft-program procedure of an erase operation according to one embodiment of the present invention.

FIG. 6 is a flow diagram showing an example of a soft-program procedure 600 of an erase operation. Soft-program procedure 600 can be used as one implementation of soft-program procedure 315 of the erase operation 300 from FIG. 3, following erase procedure 310. Soft-program procedure 600 is performed for cells in a memory block to place the Vt of any over-erased memory cells within a desired voltage range, between a soft-program verify voltage threshold (SPVT) SPVT and EVT. After starting 601, the soft programming proceeds in act 605 with initializing a current address, including a current row and column address, to a first address in a memory block (e.g. memory block 202).

In act 610, a verification is performed for the current address in the memory block. This verification 610 is a soft-program (SFT PGM) verify test that confirms whether memory cells have a suitable threshold voltage in preparation for subsequent programming.

Soft programming is typically performed on a per-page basis in which each page includes a selected number of memory cells, such as 128 cells or the like. In various implementations, a soft-program pulse may be applied to multiple memory cells at a time, such as a group of up to 36 memory cells associated with the current address. (In various implementations of a soft-program procedure, the group size can be varied based on a measured temperature.)

In one example of the soft-program verify test, the magnitude of Vt of a memory cell is checked to confirm that it is above a minimum desired soft-program verify threshold (SPVT) voltage (e.g., 2.1 V). In this example, the Vt of each memory cell at the current address is compared with the SPVT voltage. If the Vt of any memory cells is below the SPVT voltage, operation proceeds to act 612. Act 612 determines whether a maximum number of soft-program pulses has been applied.

If the maximum number of soft-program pulses has not yet been applied, operation proceeds to act 614 to apply a soft-program pulse to the memory cells that failed the soft-program verification read (from act 610) at the current address. The soft-program pulse is typically not as strong as a program pulse, such as having a lower bias voltage on the gate, a shorter pulse duration, or a combination of both. The soft-program pulse has a selected voltage level and duration to increase Vt above SPVT while remaining below EVT. Soft-program procedure 600 then returns to act 610. Operation loops among acts 610, 612, and 614 by applying additional soft-program pulses until the magnitude of Vt of each memory cell in the current group is above the SPVT voltage. If act 612 determines that the maximum number of soft-program pulses has already been applied, act 616 indicates that the erase operation (e.g., erase operation 300) has failed.

If the soft-program verify test is passed in act 610 at the current address (e.g., the Vt of each memory cell of the current group is greater than or equal to SPVT voltage), then act 618 determines whether the last address in the memory block has been soft-program verified. If the last address has not been soft-program verified, act 620 increments the current address to the next group that has not yet undergone the soft-program verify test. Operation then returns to act 610. Operation loops among acts 610, 618, and 620 (and acts 612, 614, as needed) until the Vt of each memory cell of the memory block has undergone soft-program verification. Otherwise, if the last address has been soft-program verified, soft-program procedure 600 is concluded and the erase operation has passed 699.

Figure 7:
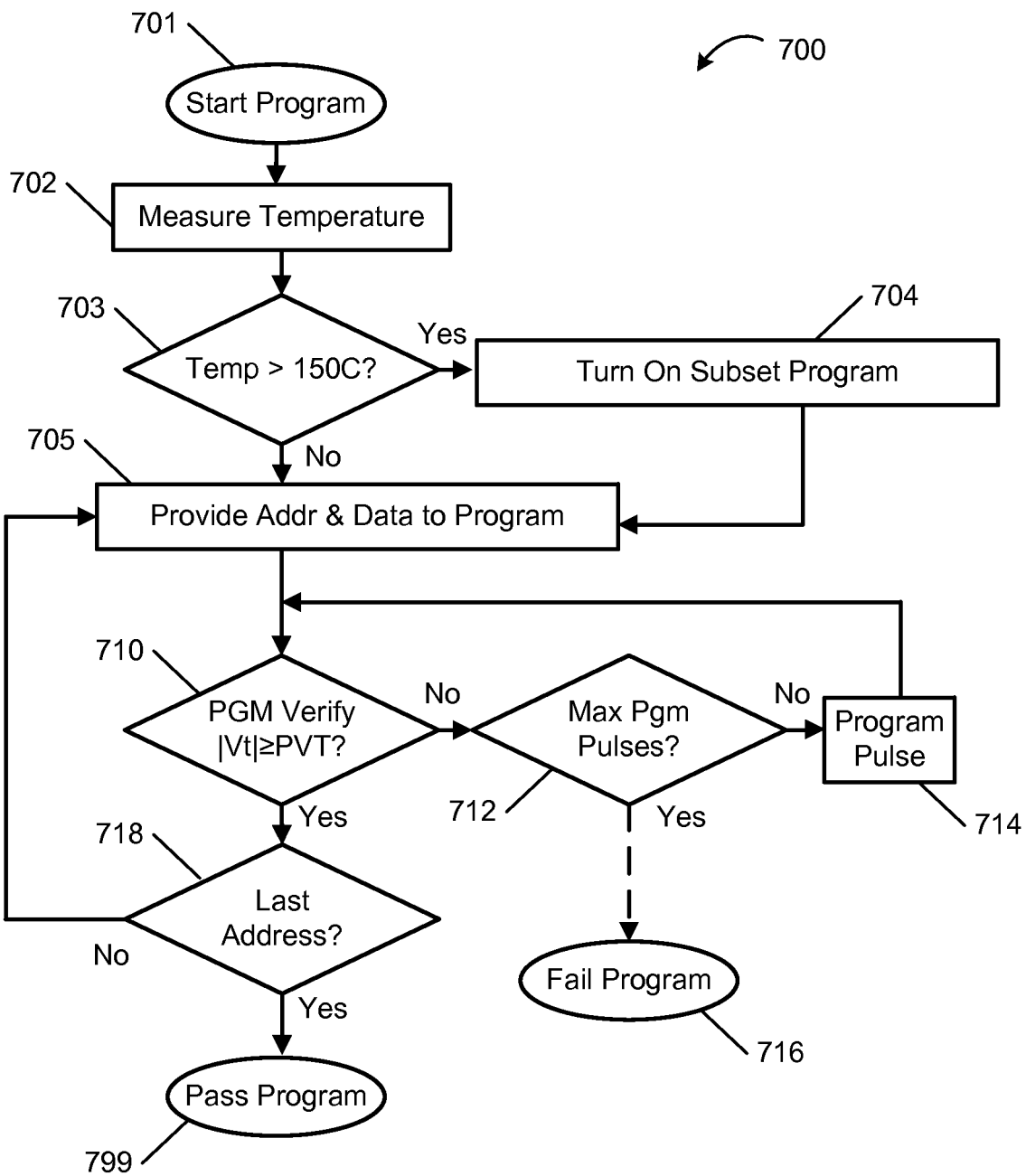
FIG. 7 is a flow diagram showing an example of a program operation according to one embodiment of the present invention.

FIG. 7 is a flow diagram showing an example of a program operation 700. For example, program operation 700 can be used for programming at least a portion of a memory block. In various implementations, program operation 700 can be generally executed and controlled by an NVM controller such as NVM controller 207 of FIG. 2.

During an initialization act 701, program operation 700 is defaulted to be performed in a full program mode, as opposed to a subset program mode in which a reduced number of the memory cells are programmed in parallel. For example, full programming may operate on a group of up to 18 memory cells at a time. A subset of the memory cells to be programmed can be a group of 9, 6, 3 or other suitable number of memory cells.

Program operation 700 then measures a temperature in act 702. This measurement can be made, for example, by temperature sensor 209 (FIG. 2). The measured temperature is then evaluated in act 703. In the illustrated example, a simple test is done with respect to a threshold temperature level, such as 150° C. (As discussed above, other factors such as temperature history may be used in the evaluation act 703.) In act 704, a subset-program option is activated. As illustrated in FIG. 7, the subset-program option is activated only if the evaluation from act 703 indicates a hot temperature (e.g., greater than a threshold temperature level). The subset-program option causes the program pulses to be performed substantially simultaneously on a reduced number of memory cells (e.g., a subset of the memory cells to be programmed can be a group of 9, 6, or 3 bits at a time) instead of substantially simultaneously on a full number of memory cells (e.g., a group of 18 bits). Alternatively, or in addition, other temperature-based and/or non-temperature-based criteria may be used to activate a subset-program option. Program operation 700 continues in act 705 by setting a first memory cell address, among addresses for groups of memory cells that are to be programmed, as a current address. The current address is provided to a control unit (e.g., controllers 213, 215 from FIG. 2). Act 705 also provides the data that is to be written into the current group of memory cells.

In act 710, a verification is performed for the current group of cells in the memory block. This verification 710 is a program verify test that confirms whether the memory cells meet a program metric.

In one example of the program verify test, the magnitude of the Vt of each memory cell at the current address is compared with a minimum program verify threshold (PVT) voltage. The PVT voltage represents the program metric for the memory cells. If the magnitude of the Vt of any of the memory cells in the current group is below the PVT voltage, operation proceeds to act 712. Act 712 determines whether a maximum number of program pulses has been applied to any of the memory cells in the current group.

If the maximum number of program pulses has not yet been applied, operation proceeds to act 714 to apply the next program pulse to the memory cells in the current group. Program operation 700 then returns to act 710. Operation loops among acts 710, 712, and 714 by applying additional program pulses until the magnitude of Vt of each of the memory cells in the current group is at or above the PVT voltage. If act 712 determines that the maximum number of program pulses has already been applied, act 716 indicates that program operation 700 has failed.

If the program verify test is passed in act 710 at the current address (e.g., the Vt of each memory cell of the current group is at or above the PVT voltage), then act 718 determines whether the last address (among addresses to be programmed) has been programmed. If the last address has not been programmed, operation returns to act 705. Operation loops among acts 705, 710, and 718 (and acts 712, 714, as needed) until programming is complete. Otherwise, if the last address has been programmed, the program operation 700 has passed 799.

The example of program operation 700 shown in FIG. 7 is set up to handle switching between full program mode and one subset program mode (with two or more subsets). The switching is based on one temperature criterion (a single temperature threshold). Program operation 700 can be configured to handle more subset program modes (with smaller subsets of memory cells) by checking a greater number of temperature criteria and using additional subset program flags.

It will be appreciated that the subset parallelism discussed with respect to erase procedure 500 and program operation 700 (FIGS. 5 and 7) can be adapted for temperature-based subset operations in pre-programming (such as pre-program procedure 400, FIG. 4) and/or in soft-programming (such as soft-program procedure 600, FIG. 6).

Figure 8:
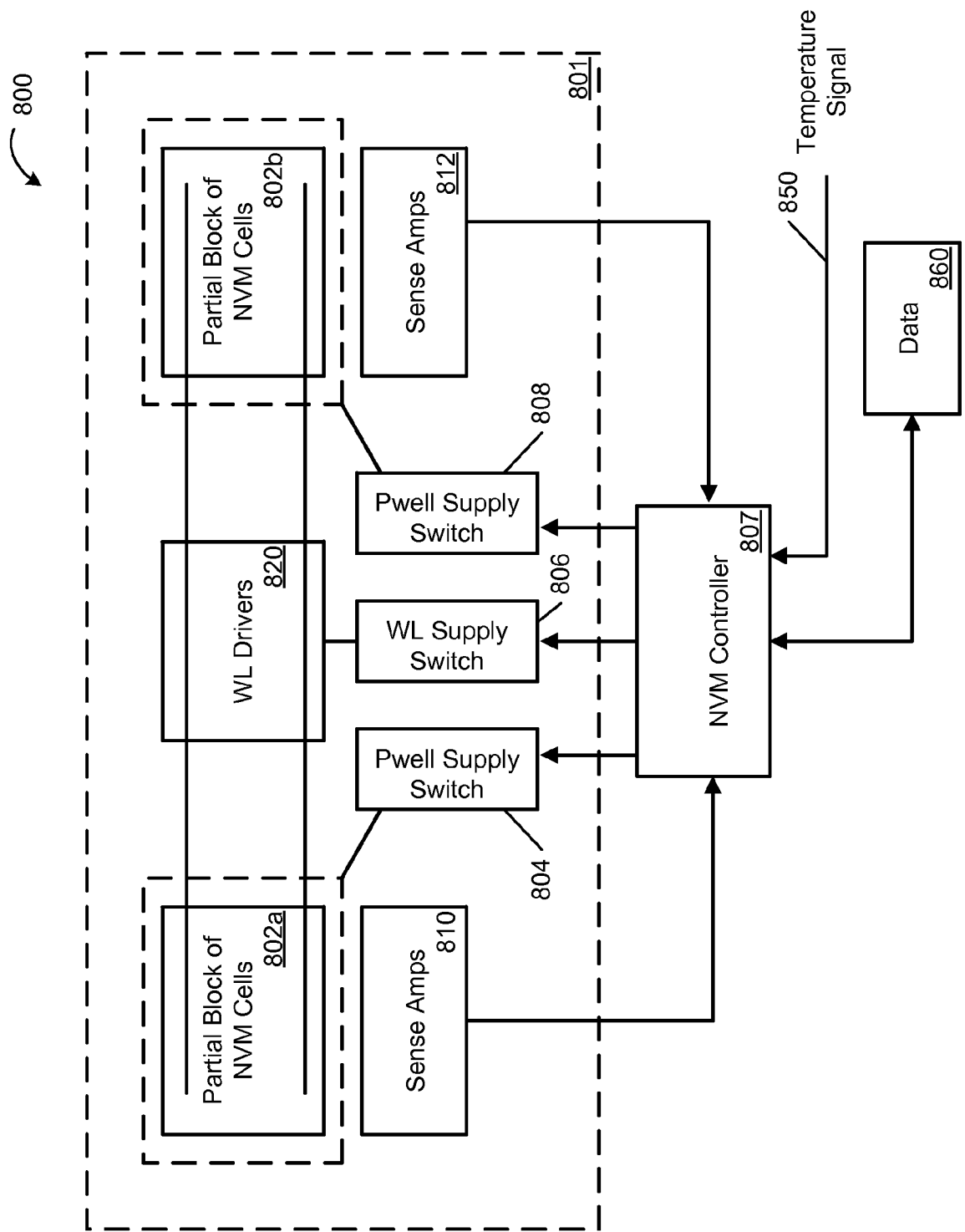
FIG. 8 is a block diagram showing an example of a memory block and an NVM controller in a non-volatile memory according to one embodiment of the present invention.

FIG. 8 is a block diagram showing an example of a memory block 801 and an NVM controller 807 in a non-volatile memory 800. In various implementations, memory 103 of FIG. 2 can use an architecture such as that of memory 800 to provide partial or full erase capability and/or partial or full program capability. Memory block 801 is shown as including two NVM sections 802a and 802b, with each of these sections including a portion of memory cells in memory block 801. Non-volatile memory 800 is configured, in various implementations, so that an erase procedure is applied on NVM sections 802a and 802b substantially simultaneously during low-temperature conditions, and sequentially during high-temperature conditions.

In various implementations, memory blocks 802a, 802b can correspond to subsets 225, 227 from FIG. 2, with each being half of memory block 801. Word line (WL) drivers 820 are coupled between NVM sections 802a, 802b. A first pwell supply switch 804 is coupled between NVM controller 807 and first NVM section 802a. A second pwell supply switch 808 is coupled between NVM controller 807 the second NVM section 802b. A word line supply switch 806 is coupled between word line drivers 820 and NVM controller 807. A first sense amplifier 810 is coupled between NVM controller 807 and first NVM section 802a. A second sense amplifier 812 is coupled between NVM controller 807 and second NVM section 802b. Sense amplifiers 810, 812 are configured to provide measurements relating to NVM sections 802a, 802b to NVM controller 807. NVM controller 807 is configured to use measurements from the sense amplifiers to monitor the NVM sections (e.g., to determine charge pump voltages, threshold voltages, or other characteristics, or combinations thereof). NVM controller 807 also receives a temperature signal 850, and is coupled to a local memory 860 to store control data. NVM controller 807 is configured, in various implementations, to engage pwell supply switches 804 and 808 simultaneously during a low-temperature procedure, and not-simultaneously during a high-temperature procedure.

In various implementations, temperature signal 850 is generated by a local measurement device such as temperature sensor 209 from FIG. 2. In other implementations, temperature signal 850 is received from a separate component or from an off-chip source.

In some implementations, local memory 860 is incorporated into NVM controller 807. In various implementations, local memory 860 is an off-chip memory. Local memory 860 can be used, for example, to store recent temperature history data for hysteresis assessments, fixed temperature threshold setpoints, programmable temperature setpoints, or other data, or combinations thereof. For example, threshold temperatures and other temperature-response criteria may be stored in local memory 860 and adjusted over time.

Local memory 860 can be used to store data for simple threshold-based switching routines, hysteresis-based switching routines, or other switching routines to be used by NVM controller for managing the parallelism for memory block 801. Temperature values (e.g., as stored in local memory 860) can be specified in degrees Celsius, degrees Fahrenheit, or other units, such as voltage values or digital values that can be used directly or indirectly for comparison with a temperature signal (e.g., signal 850).

In various implementations, NVM controller 807 is configured to operate pwell supply switches 804, 808 and word line supply switch 806 to control whether erase/program signals are provided to respective NVM sections 802a, 802b. The operation of pwell supply switches 804, 808 is controlled by a control circuit (e.g., erase parallelism control 215 from FIG. 2).

A commercially available microcontroller that utilizes a partial erase capability is the Coral microcontroller (Part #: MPC5534) available from Freescale Semiconductor, Inc. in Austin, Tex.

Figure 9:
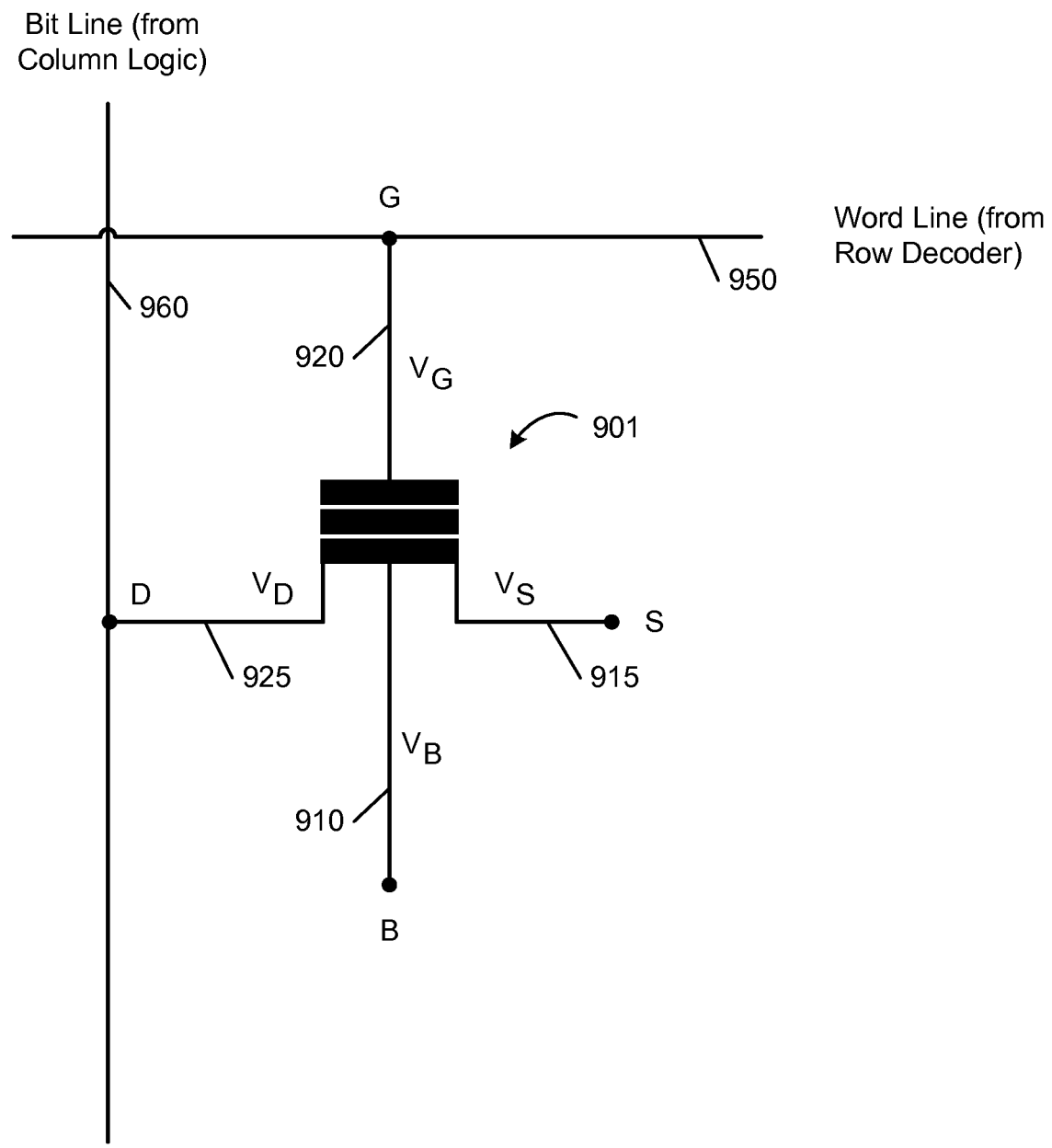
FIG. 9 is a block diagram showing an example of a non-volatile memory cell according to one embodiment of the present invention.

FIG. 9 is a block diagram showing an example of a non-volatile memory cell 901 according to one embodiment of the present invention. In various implementations, memory block 202 (FIG. 2) includes memory cells such as memory cell 901. Memory cell 901 has a body (B) terminal 910 coupled to a pwell, a source (S) terminal 915, a gate (G) terminal 920, and a drain (D) terminal 925.

In some implementations, a memory block is organized into rows and columns of memory cells 901. During an operation, body terminal 910 is connected to a body bias voltage (VB), and source terminal 915 is connected to a source bias voltage (VS). The gate terminals 920 of each row of memory cells are coupled to a corresponding one of multiple word-lines 950. Wordlines 950 are coupled to a row decoder (e.g., row decoder 203) to provide a gate bias voltage (VG) to gate terminal 920. The drain terminals 925 of each column of memory cells are coupled to a corresponding one of multiple bit lines 960. The bit lines are coupled to a column logic (e.g., column logic 205) to provide a drain bias voltage (VD).

In various embodiments, a memory controller (e.g., NVM controller 207) drives the individual voltage levels using voltage received from various charge pumps (e.g., charge pumps 220). Depending upon the operation to be performed for the memory cells 901, different body, source, gate, and drain bias voltages (VB, VS, VG, VD) are applied to the body terminals 910, source terminals 915, gate terminals 920, and drain terminals 925 for individual memory cells 901. One example of bias conditions for a program operation (e.g. during program pulse 714) or pre-program procedure (e.g. during pre-program pulse 414) is to use VB=GND, VS=GND, VG=+8.5 V, and VD=+4.2 V. One example of bias conditions for an erase procedure (e.g. during erase pulse 514) is to use VB=ramp from +4.2 V to +8.5 V, VS=float, VG=−8.5 V, and VD=float. One example of bias conditions for a soft-program procedure (e.g. during soft-program pulse 614) is to use VB=GND, VS=GND, VG=+3.0 V, and VD=+4.2 V.

By now it should be appreciated that systems and methods have been disclosed that adaptively adjust the degree of program parallelism and/or the degree of erase parallelism based on a temperature in an NVM module. In various implementations, the temperature-based parallelism can be based on comparisons to a pre-set threshold temperature. In situations where the temperature is above the threshold temperature, the number of bits to be programmed or erased in parallel are reduced, thereby reducing a load on charge pumps when needed. In various situations, this reduced load can lead to successful operation because it may reduce the leakage that needs to be overcome in an NVM module. The ability to adaptively adjust the number of memory cells being programmed or erased in parallel can enable components, in some implementations, to be used in higher temperature environments without requiring performance to be reduced for lower temperatures. This ability can, in various implementations, also improve the reliability of a component at the beginning and/or at the end of the useful life of the component.

A threshold temperature can be predetermined based on expectations regarding the effects of temperature on the capabilities of an NVM module's charge pumps (or other sources of voltage, current, or power). For example, the threshold temperature may be a temperature below which the charge pumps are expected to reliably supply voltage to a normal number of bits during program or erase operations. In various implementations, the threshold temperature is 150 degrees Celsius. In other implementations, the threshold temperature can have other values, such as 75, 100, 125, 145, 149, 165, 170, or 175 degrees Celsius, for example. The threshold temperature may be determined by computational simulations, empirical observation, or a combination thereof.

Moreover, more than one threshold temperature may be used in various implementations of an NVM module. In one example, during operations up to a first threshold temperature (e.g., 140 degrees Celsius), a first number of bits are programmed or erased in parallel. At temperatures above the first threshold temperature but below a second threshold temperature (e.g. 150 degrees Celsius), only a second number of bits—less than the first number—are programmed or erased in parallel. At yet higher temperatures above the second threshold, only a third number of bits—less than the second number—are programmed or erased in parallel. The reduced number of bits at higher temperatures means that the charge pumps are required to deliver a smaller amount of current, and therefore can operate more reliably despite the higher temperatures.

Further threshold levels or other functional relationships (e.g. piecewise linear, polynomial, exponential, lookup-table, or others, or combinations thereof) can be used to control the number of bits to be programmed or erased in parallel as a function of temperature. Moreover, in various implementations, the number of bits to be erased in parallel may be based on different thresholds (or other temperature relationships) than the number of bits to be programmed in parallel. Moreover, in various implementations, an NVM module may adjust its temperature dependencies over the lifetime of the NVM. For example, an NVM module may be configured to reduce the threshold temperature according to a preprogrammed schedule over the lifetime of the NVM module. In other examples, an NVM module may be configured to revise its temperature dependencies in response to self-test assessments performed over the lifetime of the NVM module.

In various implementations of a parallelism determination (e.g., acts 503, 703), decisions may be based on additional criteria other than temperature measurements. For example, a parallelism determination may be based in part on performance criteria such as an assessment of charge pump capacity, or an assessment of current leakage. In various implementations of NVM controller 807, a temperature threshold may be deemed irrelevant (or relevant) based on a strong performance (or weak performance) of a voltage supply during operation near the threshold temperature. Similarly, a temperature threshold may be adjusted up or down and overwritten in local memory 860 based on a strong or weak performance of a charge pump, and/or based on low or high detected leakage conditions.

In one approach, a method of performing an operation on memory cells of a memory array to a first logic state using a voltage of a charge pump includes comparing a measured temperature to a threshold temperature. If the measured temperature is above the threshold temperature, the load on a charge pump is reduced by providing the voltage to a reduced number of memory cells, wherein the reduced number of memory cells is a first subset of the memory cells. In a further approach, the operation includes performing a program procedure, an erase procedure, a soft-programming procedure, or a pre-programming procedure, or a combination thereof.

In a further approach, the method includes completing a memory operation on a first subset of the memory cells and initiating the operation on a second subset of the memory cells. Based on a measured temperature, the operation on the second subset is initiated only after the operation on the first subset has been completed.

It is to be understood that the architectures depicted herein are merely exemplary, and that in fact many other architectures can be implemented that use the techniques described herein. In various implementations, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

For example, one version of a method for performing a memory operation on memory cells of a memory array includes receiving a signal and providing a voltage to a number of the memory cells. The signal indicates a measured temperature, and the number is based at least in part on the measured temperature. In various implementations, the operation can include writing the memory cells to a first logic state using a voltage of a charge pump, the measured temperature can be indicative of a load on the charge pump, the memory cells can be arranged in a plurality of pages, each page can have a plurality of the memory cells, and performing the operation can include performing a program operation on a first page among the pages.

Moreover, in various implementations the method can include comparing the measured temperature to a first temperature threshold, determining that the measured temperature is less than the first temperature threshold, and, in response to the determining that the measured temperature is less than the first temperature threshold, enabling the memory operation by providing the voltage to a set of the memory cells. Similarly, in various implementations the method can include determining that the measured temperature is greater than the first temperature threshold and, in response to the determining that the measured temperature is greater than the first temperature threshold, enabling a second memory operation by providing the voltage to a first subset of the set of the memory cells, and by providing the voltage, after completion of providing the voltage to the first subset of the set of the memory cells, to a second subset of the set of the memory cells.

In various implementations, the performing the memory operation can include a program procedure, a soft-programming procedure, a pre-programming procedure, and/or an erase procedure. Similarly, the method can include sequentially erasing groups of the memory cells, with each of the groups having the same number of memory cells. Moreover, performing the memory operation can include pre-programming the memory cells prior to beginning the erase procedure, and soft-programming selected memory cells after the completing the erase procedure.

Another example of a method includes determining whether a temperature of a non-volatile memory (NVM) module meets a first criterion and supplying a voltage to a first set of NVM units in the NVM module. The voltage is supplied to a second set of NVM units in the NVM module simultaneously with the first set of NVM units only if the temperature meets the first criterion. Otherwise, the voltage is prevented from being supplied to the second set of NVM units while the voltage is being supplied to the first set of NVM units.

Various examples of a system include a plurality of non-volatile memory cells, a voltage supply configured to provide a voltage for a memory operation, a temperature sensor configured to measure a temperature, and a controller. In some implementations, the controller is configured to couple the voltage supply with memory cells that are selected based at least in part on the temperature. In various implementations of the system, the voltage supply can include one or more charge pumps. Moreover, the controller can be configured to couple the voltage supply with groups of memory cells to perform a memory operation to a first logic state on the groups, the controller can be configured for determining whether the temperature is above a threshold, and the controller can be configured for selecting, based on a determination that the temperature is above the threshold, only a first subset of the memory cells for a parallel writing operation. In various implementations, the temperature sensor can be included in the controller; the temperature sensor can be configured to measure an operating temperature of the memory cells; the temperature sensor can be configured to couple the voltage supply with selected memory cells among the memory cells based at least in part on a temperature threshold. In various implementations of the system, the temperature thresholds are fixed values, programmable values, or combinations thereof. The temperature threshold setting can be, in various implementations, based at least in part on a device leakage characteristic.

Various other examples of a system include a first set of non-volatile memory units, a second set of NVM units, and a control circuit coupled to the first and second NVM units. The control circuit is configured to supply voltage simultaneously to the first and second sets of NVM units based at least in part on a first temperature criterion. The control circuit is configured to supply voltage sequentially to the first and second sets of NVM units based at least in part on a second temperature criterion. In one implementation, the first temperature criterion is based at least in part on a temperature-dependent performance characteristic, e.g., a measured or calculated leakage characteristic. In one implementation, the first temperature criterion is a temperature measurement below a first threshold temperature and the second temperature criterion is a temperature measurement above a second threshold temperature. The first set of NVM units includes, in some versions, a set of flash memory cells that are configured to be erased simultaneously and/or configured to be programmed in a block operation. In various configurations, the system includes a first switch between the electrical supply and the first set of NVM units and a second switch between the electrical supply and the second set of NVM units, with the control circuit configured to simultaneously close the first and second switches based at least in part on the first temperature criterion, and configured to close the first switch and open the second switch based at least in part on the second temperature criterion.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the spirit and scope of the disclosure as defined by the appended claims.

What is claimed is:

1. A method comprising:
    receiving a signal, wherein the signal indicates a measured temperature; and
    performing a memory operation on a group of memory cells that is a subset of a memory block, wherein the number of memory cells of the group is less than a full number of memory cells in the memory block and is based at least in part on the measured temperature, and wherein the memory operation is performed substantially simultaneously on only the group of memory cells, and wherein the performing the memory operation comprises performing a write operation on the group of memory cells.

2. The method of claim 1, comprising:
    providing a voltage to terminals of the group of memory cells.

3. The method of claim 1, wherein the performing the memory operation comprises writing the memory cells to a first logic state using a voltage of a charge pump.

4. The method of claim 3, wherein the measured temperature is indicative of a temperature of one or more of the memory cells.

5. The method of claim 1, wherein the memory cells are arranged in a plurality of pages, each page has a plurality of the memory cells, and the performing the memory operation comprises performing a program operation on a first page among the pages.

6. The method of claim 1, comprising:
    comparing the measured temperature to a first temperature threshold.

7. The method of claim 6, comprising:
determining that the measured temperature is less than the first temperature threshold; and
in response to the determining that the measured temperature is less than the first temperature threshold, enabling the memory operation by providing a voltage to a set of the memory cells.

8. The method of claim 7, comprising:
determining that the measured temperature is greater than the first temperature threshold; and
in response to the determining that the measured temperature is greater than the first temperature threshold, enabling a second memory operation by providing the voltage to a first subset of the set of the memory cells, and
after completion of providing the voltage to the first subset of the set of the memory cells, providing the voltage to a second subset of the set of the memory cells.

9. The method of claim 1, wherein the performing the memory operation comprises performing a program operation on the group of memory cells.

10. The method of claim 1, wherein the performing the memory operation comprises performing an erase operation on the group of memory cells.

11. The method of claim 1, comprising:
sequentially erasing groups of the memory cells, wherein each of the groups of memory cells has a same number of memory cells.

12. A method comprising:
receiving a signal, wherein the signal indicates a measured temperature; and
performing a memory operation on a group of memory cells that is a subset of a memory block, wherein the number of memory cells of the group is less than a full number of memory cells in the memory block and is based at least in part on the measured temperature, and wherein the memory operation is performed substantially simultaneously on only the group of memory cells, wherein the performing the memory operation comprises performing a read operation on the group of memory cells.

13. A system comprising:
a plurality of non-volatile memory cells;
a voltage supply configured to provide a voltage for a memory operation;
a temperature sensor configured to measure a temperature; and
a controller coupled to the memory cells, the voltage supply, and the temperature sensor, wherein the controller is configured to
perform a memory operation on a group of memory cells among the memory cells, wherein the number of memory cells of the group is less than a total number of the memory cells and is based at least in part on the temperature, and wherein the memory operation is performed substantially simultaneously on only the group of memory cells,
wherein the voltage supply comprises one or more charge pumps configured to provide the voltage to:
wells of the memory cells; or
gates of the memory cells.

14. The system of claim 13, wherein:
the controller is configured to couple the voltage supply with groups of memory cells to perform a write to a first logic state on the groups of memory cells;
the controller is configured for determining whether the temperature is above a threshold; and
the controller is configured for selecting, based on a determination that the temperature is above the threshold, only a first subset of the memory cells for a parallel writing operation.

15. The system of claim 13, wherein the controller is configured to:
select, based at least in part on the temperature, the group of memory cells, and couple the voltage supply with the group of memory cells.

16. The system of claim 13, wherein the temperature sensor is configured to measure an operating temperature of the memory cells.

17. The system of claim 13, wherein the controller is configured to couple the voltage supply with selected memory cells among the memory cells based at least in part on:
at least one temperature threshold setting, wherein the temperature threshold setting is a programmable value stored in the controller.

18. A system comprising:
a plurality of non-volatile memory cells;
a voltage supply configured to provide a voltage for a memory operation;
a temperature sensor configured to measure a temperature; and
a controller coupled to the memory cells, the voltage supply, and the temperature sensor, wherein the controller is configured to
perform a memory operation on a group of memory cells among the memory cells, wherein the number of memory cells of the group is less than a total number of the memory cells and is based at least in part on the temperature, and wherein the memory operation is performed substantially simultaneously on only the group of memory cells,
wherein the voltage supply comprises one or more charge pumps configured to provide the voltage to terminals of the memory cells, and the temperature is indicative of a temperature of at least one of the charge pumps.

* * * * *